United States Patent
Kinugasa et al.

[11] Patent Number: 5,825,220
[45] Date of Patent: Oct. 20, 1998

[54] AUTO-CLEAR CIRCUIT AND INTEGRATED CIRCUIT INCLUDING AN AUTO-CLEAR CIRCUIT FOR INITIALIZATION BASED ON A POWER SUPPLY VOLTAGE

[75] Inventors: Masanori Kinugasa, Yokohama; Hiroshi Shigehara, Oita; Akira Takiba, Kawasaki, all of Japan

[73] Assignee: Kabushiki Kaisha Toshiba, Kawasaki, Japan

[21] Appl. No.: 778,743

[22] Filed: Jan. 2, 1997

[30] Foreign Application Priority Data

Jan. 16, 1996 [JP] Japan ................................. 8-004820

[51] Int. Cl.⁶ ................................................. H03K 17/22
[52] U.S. Cl. ........................... 327/143; 327/142; 327/198
[58] Field of Search ................................ 327/142, 143, 327/198

[56] References Cited

U.S. PATENT DOCUMENTS

| | | | |
|---|---|---|---|
| 4,581,552 | 4/1986 | Womack et al. | 327/142 |
| 4,804,929 | 2/1989 | Kato et al. | 331/57 |
| 5,172,012 | 12/1992 | Ueda | 327/143 |
| 5,323,067 | 6/1994 | Shay | 327/142 |

FOREIGN PATENT DOCUMENTS 0 430 399  6/1991  European Pat. Off. .
WO 86/05933 10/1986  WIPO .

*Primary Examiner*—Kenneth B. Wells
*Attorney, Agent, or Firm*—Oblon, Spivak, McClelland, Maier & Neustadt, P.C.

[57] ABSTRACT

An auto-clear circuit which has a switch device connected between a power supply voltage terminal and first and second nodes, and a potential division device, connected between the first node and a ground terminal, for outputting a first potential obtained by dividing a potential of the first node. Also included is a charge/discharge device, connected between the second node and a ground terminal, for charging or discharging the second node on the basis of the first potential output from the potential division device, and a latch device for holding a potential of the second node to output a signal from an output terminal, and supplying the signal to the switch device to control an opening/closing operation.

8 Claims, 6 Drawing Sheets

PRIOR ART
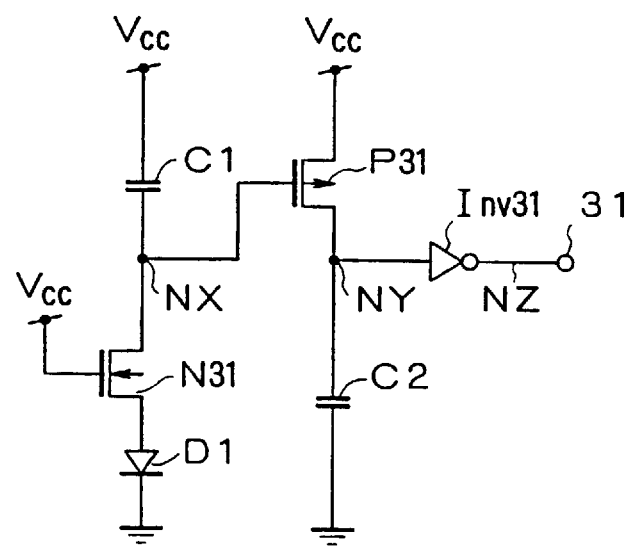
F I G. 1

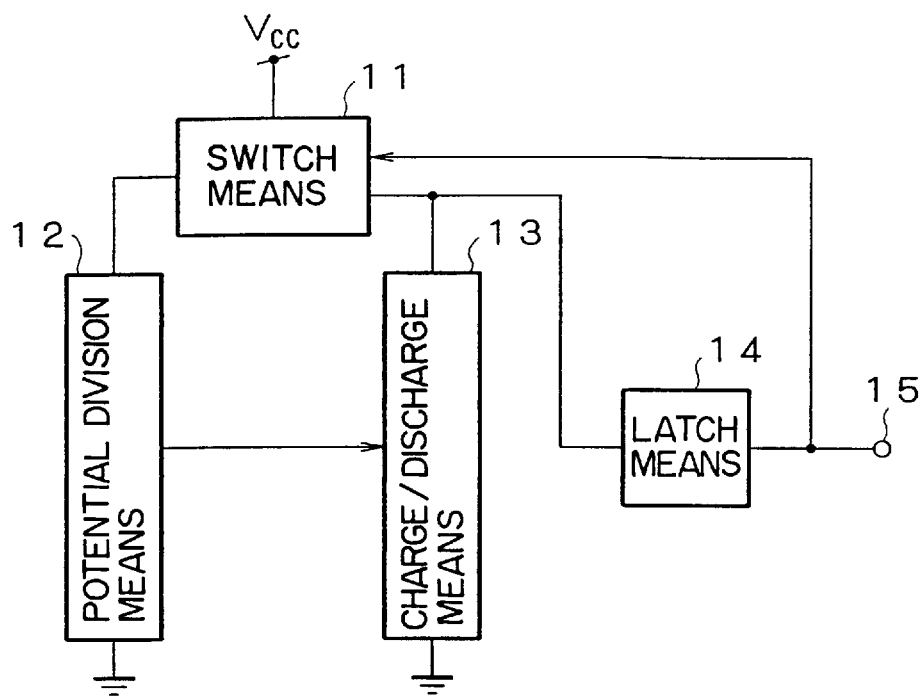
F I G. 4
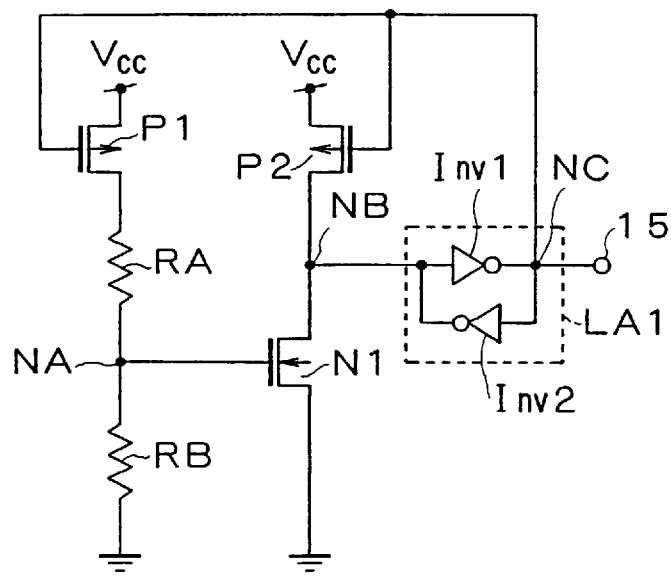
F I G. 5

AUTO-CLEAR CIRCUIT AND INTEGRATED CIRCUIT INCLUDING AN AUTO-CLEAR CIRCUIT FOR INITIALIZATION BASED ON A POWER SUPPLY VOLTAGE

BACKGROUND OF THE INVENTION

The present invention relates to an auto-clear circuit which generates a reset signal for initializing an integrated circuit when power is applied.

Integrated circuits of, e.g., a calculator and a timepiece must be initialized when power is applied. An auto-clear circuit is used to generate a pulse upon detecting the application of power and set an integrated circuit to a predetermined state by using this pulse.

FIG. 1 shows an example of the configuration of a background auto-clear circuit. The two terminals of each of a capacitor C1, an N-channel transistor N31, and a diode D1 are serially connected between a terminal of a power supply voltage Vcc and a ground terminal. The power supply voltage Vcc is applied to the gate of the transistor N31. The two terminals of each of a P-channel transistor P31 and a capacitor C2 are serially connected between the terminal of the power supply voltage Vcc and the ground terminal. The gate of the transistor P31 is connected to a node NX which connects the capacitor C1 and the drain of the N-channel transistor N31. A node NY, which connects the source of the P-channel transistor P31 and one terminal of the capacitor C2, is connected to the input terminal of an inverter Inv31. An output node NZ of the inverter Inv31 is connected to an output terminal 31.

As shown in FIG. 2, if the power supply voltage Vcc rises steeply, the capacitor C1 is charged to increase the potential of the node NX to a threshold voltage Vthn of the N-channel transistor. Then, the potential of the node NX gradually decreases. When this potential decreases from the power supply voltage Vcc to less than an absolute value |Vthp| of a threshold voltage Vthp of the P-channel transistor, the P-channel transistor P31, which receives this potential from its gate, is turned on. With this operation, the node NY is charged to increase its potential. The inverter Inv31 outputs a signal of high level during a period between the time at which the power supply voltage Vcc increases to reach the absolute value |Vthp| of the threshold value Vthp and time at which the node NY reaches the absolute value |Vthp| of the threshold voltage Vthp.

In this manner, when the power supply voltage Vcc rises steeply, the output terminal 31 outputs a clear square pulse, as shown in FIG. 2. An integrated circuit on the output stage connected to the output terminal 31 receives this pulse and is initialized.

To the contrary, when the power supply voltage Vcc rises moderately, as shown in FIG. 3, no clear square pulse is output in some cases. If the power supply voltage Vcc gradually increases, the potential of the node NX increases with a similar gradient. After reaching the threshold voltage Vthn, the potential decreases. When the potential of the node NX decreases by the absolute value |Vthp| of the threshold voltage Vthp, the potential of the node NY increases. The potential of the output terminal 31, i.e., the potential of the node NZ increases during a period between the time at which the power supply voltage Vcc increases to reach the absolute value |Vthp| of the threshold voltage Vthp and the time at which the potential of the node NY reaches the threshold voltage Vthn. If the power supply voltage Vcc rises moderately, a square pulse is not output, as shown in FIG. 3. In some cases, not only a pulse having a square shape but also pulses having other shapes may rarely be output.

As described above, when a power supply voltage rises moderately, no pulse is obtained and initialization is impossible in the conventional auto-clear circuit.

SUMMARY OF THE INVENTION

It is, therefore, an object of the present invention to provide an auto-clear circuit capable of stably generating a signal required for initialization regardless of the rise rate of a power supply voltage, and an integrated circuit including the auto-clear circuit.

According to the present invention, there is provided an auto-clear circuit comprising switch means connected between a power supply voltage terminal and first and second nodes, potential division means, connected between the first node and a ground terminal, for outputting a first potential obtained by dividing a potential of the first node, charge/discharge means, connected between the second node and a ground terminal, for charging or discharging the second node on the basis of the first potential output from the potential division means; and latch means for holding a potential of the second node to output a signal from an output terminal, and supplying the signal to the switch means to control an opening/closing operation.

In this manner, the charge/discharge means performs a charge/discharge operation on the basis of the first potential obtained by dividing the power supply voltage and output from the potential division means, and the latch means holds the output potential and outputs a signal. Even if the rise rate of the power supply voltage is low, an internal circuit can be reliably reset by using this signal. In addition, no power supply voltage is applied to the potential division means and the charge/discharge means after the end of the reset operation by controlling the opening/closing operation of the switch means by using this signal, thereby reducing the power consumption.

The potential division means, while the switch means is closed, may receive a potential output from the switch means via the first node and output the first potential, the charge/discharge means, while the switch means is closed, may charge the second node until the first potential reaches a first predetermined potential, and discharge the second node when the first potential reaches the first predetermined potential, the latch means may latch the potential of the second node when the potential of the second node exceeds a second predetermined potential, and output the signal, and the switch means may be closed until the signal reaches a third predetermined potential, and opened when the signal reaches the third predetermined potential.

The switch means may comprise a first P-channel transistor having two terminals connected between a power supply voltage terminal and the first node and a gate which receives the signal output from the latch means, and a second P-channel transistor having two terminals connected between the power supply voltage terminal and the second node and a gate which receives the signal output from the latch means, the potential division means may comprise a plurality of resistors serially connected between the first node and a ground terminal, and output the first potential from a connection point between the resistors, the charge/discharge means may comprise a first N-channel transistor having two terminals connected between the second node and the ground terminal and a gate which receives the first potential, and the latch means may comprise a first inverter having an input side connected to the second node and an output side connected to the output terminal, and a second inverter having an input side connected to the output terminal and an output side connected to an input terminal.

The first inverter may comprise a third P-channel transistor and a second N-channel transistor each having two terminals serially connected between the power supply voltage terminal and the ground terminal, the third P-channel transistor and the second N-channel transistor having gates commonly connected to the second node, and drains commonly connected to the output terminal, and the second inverter may comprise a fourth P-channel transistor and a third N-channel transistor each having two terminals serially connected between the power supply voltage terminal and the ground terminal, the fourth P-channel transistor and the third N-channel transistor having gates commonly connected to the output terminal, and drains commonly connected to the second node, the fourth P-channel transistor having a conductance set larger than that of the third P-channel transistor.

Further, an integrated circuit of the present invention comprises the above auto-clear circuit, an internal circuit for performing a predetermined process with respect to a signal externally input, and an output circuit for amplifying the signal output from the internal circuit and outputting the amplified signal, the output circuit supplying a high-impedance output during a predetermined period when power is applied, and the auto-clear circuit outputs a reset signal.

BRIEF DESCRIPTION OF THE DRAWINGS

FIG. 1 is a circuit diagram showing the configuration of an auto-clear circuit related to the present invention;

FIG. 4 is a block diagram showing the arrangement of an auto-clear circuit according to a first embodiment of the present invention;

FIG. 5 is a circuit diagram showing the configuration of an auto-clear circuit according to the first embodiment of the present invention;

DESCRIPTION OF THE PREFERRED EMBODIMENTS

Figure 2:
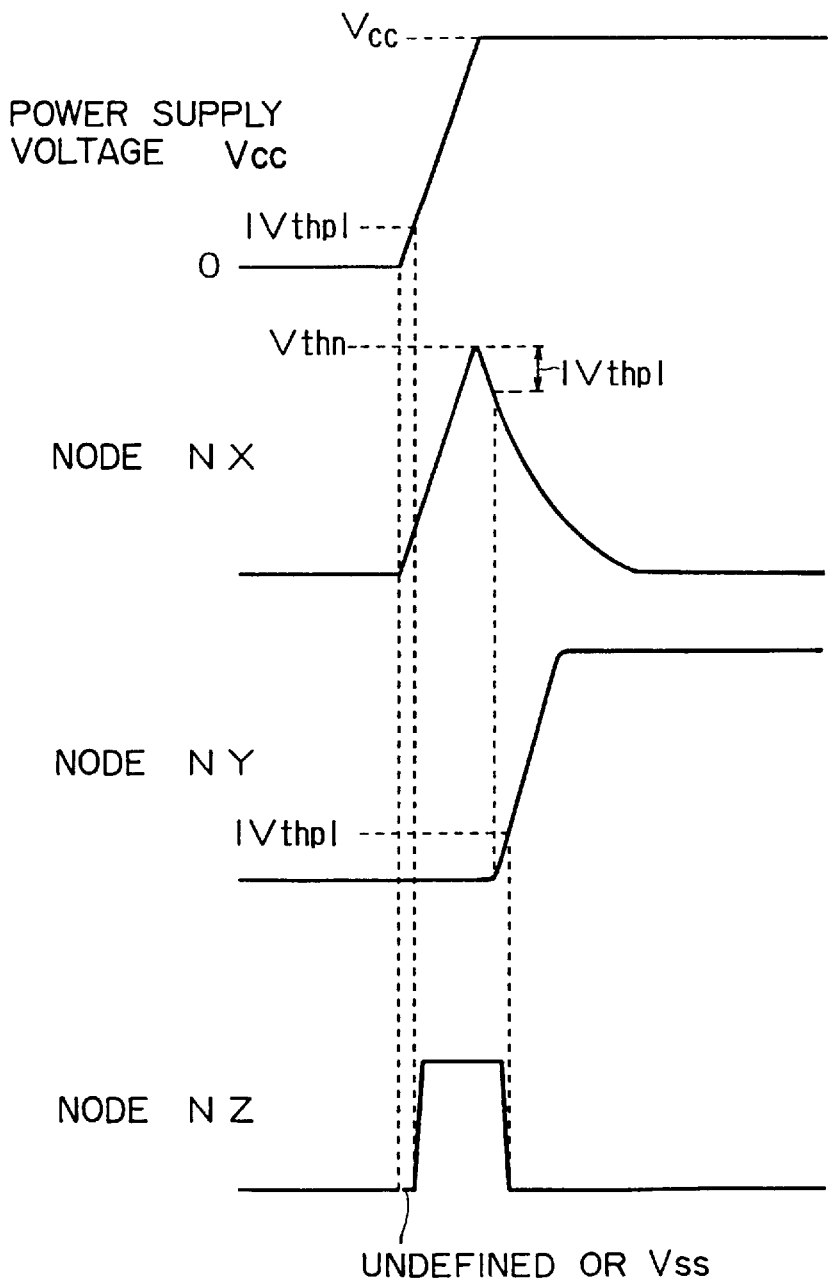
FIG. 2 is a timing chart showing changes in output waveforms of respective nodes when the rise rate of a power supply voltage is high in the auto-clear circuit.
Figure 3:
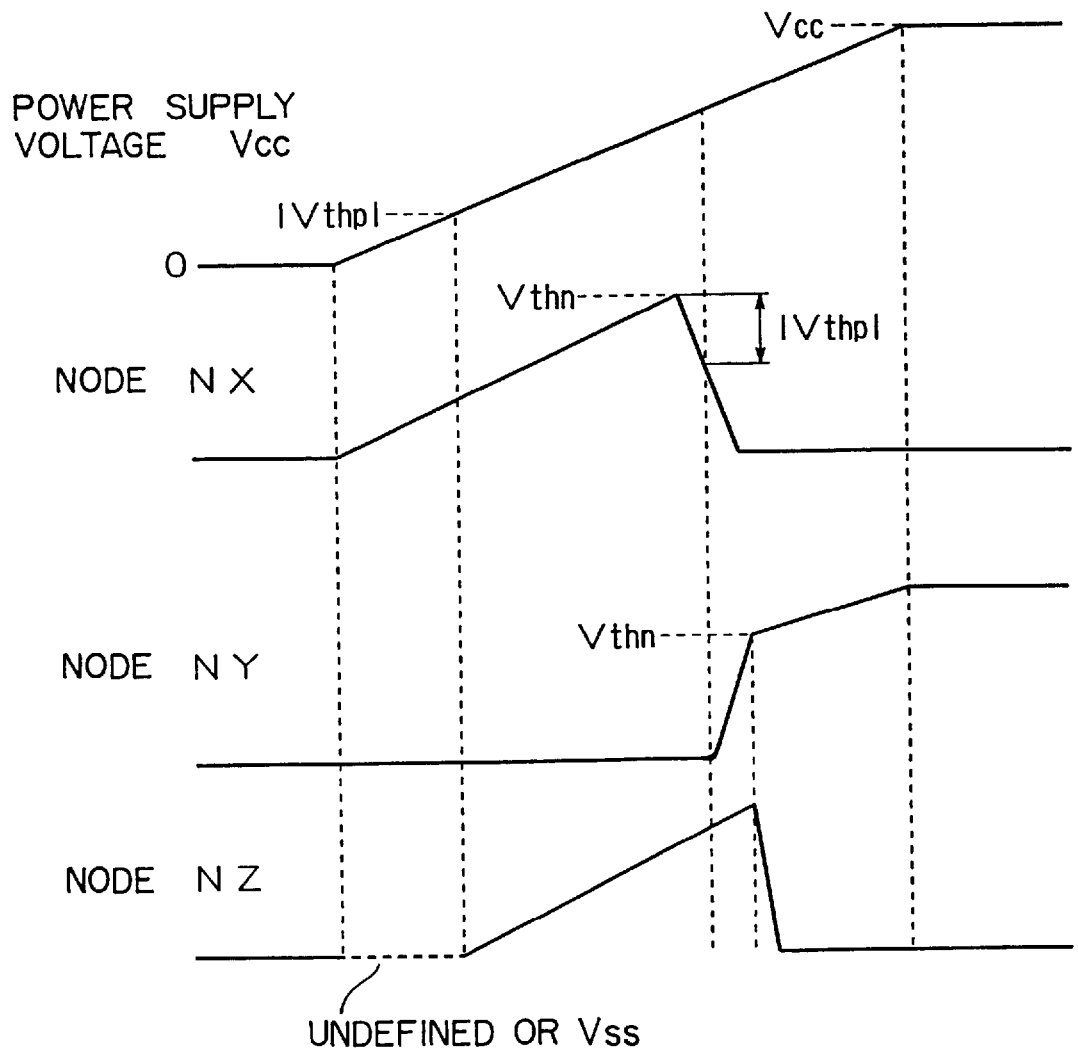
FIG. 3 is a timing chart showing changes in output waveforms of the respective nodes when the rise rate of the power supply voltage is low in the auto-clear circuit.

An embodiment of the present invention will be described below with reference to the accompanying drawings.

FIG. 4 shows the arrangement of an auto-clear circuit according to the first embodiment. The input terminal of a switch means 11 is connected to the terminal of a power supply voltage Vcc. A potential division means 12 is connected between one output terminal of the switch means 11 and a ground terminal, and a charge/discharge means 13 is connected between the other output terminal and the ground terminal. The charge/discharge means 13 operates to charge and discharge the other output terminal of the switch means 11, which operation is controlled by an output from the potential division means 12. The potential of this output terminal of the switch means 11 is held by a latch means 14, and a signal is output from an output terminal 15. The opening/closing operation of the switch means 11 is controlled by a signal output from the latch means 14.

The switch means 11 is OFF when the power supply voltage Vcc is at the ground level, and is turned on at the start of increasing the power supply voltage Vcc. Upon turning on the switch means 11, the power supply voltage Vcc is applied to the potential division means 12, which outputs a potential obtained by dividing this power supply voltage Vcc at a predetermined ratio, to the charge/discharge means 13. While the switch means 11 is ON, the charge/discharge means 13 charges or discharges the other output terminal of the switch means 11 in accordance with the output from the potential division means 12. The potential of the other output terminal of the switch means 11, which changes with the operation of the charge/discharge means 13, is held by the latch means 14. A reset signal is output from the output terminal 15 to an internal circuit to perform initialization. Further, the potential of the output terminal 15 is supplied to the switch means 11. When the potential of the output terminal 15 reaches a predetermined potential, the switch means 11 is turned off. With this operation, the supply of the power supply voltage Vcc to the potential division means 12 and the charge/discharge means 13 is stopped to reduce the power consumption.

FIG. 5 shows the configuration of an auto-clear circuit according to the first embodiment of the present invention. The two terminals of a P-channel transistor P1 and resistors RA and RB are serially connected between the terminal of a power supply voltage Vcc and a ground terminal. A P-channel transistor P2 and an N-channel transistor N1 are serially connected between the terminal of the power supply voltage Vcc and the ground terminal. The gates of the P-channel transistors P1 and P2 are connected to a node NC connected to an output terminal 15. The gate of the N-channel transistor N1 is connected to a node NA, which connects the resistors RA and RB. A latch circuit LA1 constituted by inverters Inv1 and Inv2 is connected between the node NC and a node NB which connects the drains of the P-channel transistor P2 and the N-channel transistor N1.

Figure 6:
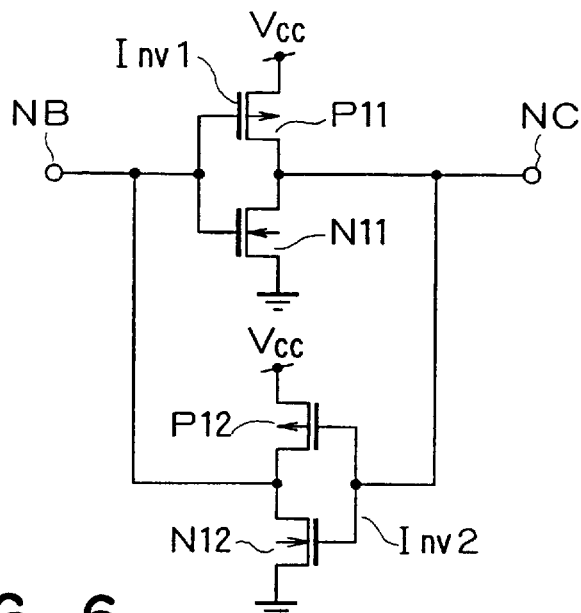
FIG. 6 is a circuit diagram showing the configuration of a latch circuit in the auto-clear circuit according to the first embodiment.

The latch circuit LA1 has a configuration shown in FIG. 6. The inverter Inv1 constituted by a P-channel transistor P11 and an N-channel transistor N11, and the inverter Inv2 constituted by a P-channel transistor P12 and an N-channel transistor N12 are arranged between the nodes NB and NC.

In relation with the first embodiment, the P-channel transistors P1 and P2 in this circuit correspond to the switch means 11; the resistors RA and RB, the potential division means 12; the N-channel transistor N1, the charge/discharge means 13; and the latch circuit LA1, the latch means 14.

Figure 7:
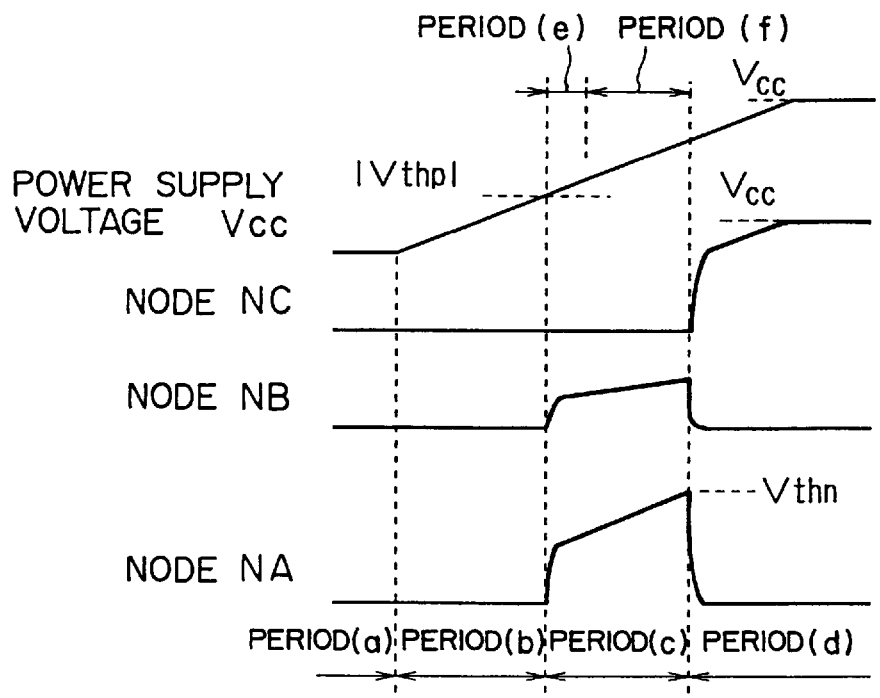
FIG. 7 is a timing chart showing changes in output waveforms of respective nodes in the auto-clear circuit according to the first embodiment.

In the first embodiment, the circuit operates as follows with an increase in power supply voltage Vcc. FIG. 7 shows the respective potentials of the power supply voltage Vcc and the nodes NA and NB. In period (a) before the power supply voltage Vcc starts to increase, both the transistors P1 and P2 are OFF, and the node NA is at the ground potential. The transistor N1, which receives this potential from its gate, is also OFF. The node NB is in a floating state because the transistor N1 is OFF, is applied with no power supply voltage because the transistor P2 is also OFF, and is stabilized at the ground potential by a leakage current. The potential of the output node NC of the latch circuit LA1, which receives the potential of the node NB, is also at the ground potential.

In period (b) between the time at which the power supply voltage Vcc starts to increase and the time at which it reaches an absolute value |Vthp| of a threshold voltage Vthp of the P-channel transistors P1 and P2, all the nodes NA, NB, and NC are at the ground potential.

In period (c) after the power supply voltage Vcc reaches the absolute value |Vthp| of the threshold voltage Vthp, the potential of the node NB tends to increase by the inverters Inv2, and the potential of the node NC tends to increase by the inverter Inv1. A conductance gm of the P-channel transistor included in the inverter Inv2 is set larger than the conductance gm of the P-channel transistor included in the inverter Inv1. With this setting, the potential of the node NB increases, and the node NC is stabilized at the ground potential. The potential of the node NC is input to the gates of the P-channel transistors P1 and P2 to keep the ON state. The node NA has a potential obtained by resistance-dividing the power supply voltage by the resistors RA and RB. When the potential of the node NA reaches a threshold voltage Vthn of the N-channel transistor N1, the N-channel transistor N1, which receives this potential from its gate, is turned on, and the node NB is grounded. Period (c) is a period between time at which the power supply voltage Vcc reaches the absolute value |Vthp| of the threshold voltage Vthp of the P-channel transistor and time at which the potential of the node NA reaches the threshold voltage Vthn of the N-channel transistor. In period (c), if the relation of |Vthp|=Vthn or |Vthp|>Vthn is established, an integrated circuit connected to the output terminal 15 is set in a normal operation state. Therefore, the ground potential of the node NC in period (c) can be regarded as a reset signal used for an auto-clear operation. Period (c) is defined as a reset period.

In period (d) after the potential of the node NA reaches the threshold voltage Vthn of the N-channel transistor, and both the potentials of the nodes NB and NA decrease to the ground potential, the ground potential of the node NB is inverted by the inverter Inv1, and the potential of the node NC increases to that of the power supply voltage Vcc and is stabilized. The P-channel transistors P1 and P2, which receive the potential of the node NC from their gates, are turned off, and the supply of the power supply voltage to the nodes NA and NB is stopped. With this operation, after the end of period (c) corresponding to the reset period, no current path is formed between the terminal of the power supply voltage Vcc and the ground terminal to prevent unnecessary power consumption.

Period (c) is divided into periods (e) and (f), as shown in FIG. 7 Period (e) is a period in which the absolute value |Vthp| of the threshold voltage Vthp of the P-channel transistor and the threshold voltage Vthn of the N-channel transistor vary due to variations in process and the like to vary a reset start voltage. If |Vthp|>Vthn, the reset period is set after the power supply voltage exceeds the threshold voltage Vthn and reaches |Vthp|. If |Vthp|<Vthn, the reset period is set after the power supply voltage exceeds the threshold voltage |Vthp| and reaches Vthn.

Period (f) corresponds to a reset period when |Vthp|<Vthn is established between the threshold voltage Vthp of the P-channel transistor and the threshold voltage Vthn of the N-channel transistor.

In this manner, the start timing of the reset period is time at which the power voltage reaches a higher one of the absolute value |Vthp| of the threshold voltage Vthp of the P-channel transistor and the threshold voltage Vthn of the N-channel transistor.

The range of the power supply voltage Vcc in which reset period (c) can exist will be considered below. The standard value of the absolute value |Vthp| of the threshold voltage Vthp of the P-channel transistor is set at 0.8 V, and the variation is at ±0.2 V. The standard value of the threshold voltage Vthn of the N-channel transistor is set at 0.8 V, and the variation is at ±0.2 V. The ratio of the resistance values of the resistors RA and RB is set at RA=2*RB.

The potential of the power supply voltage Vcc at the start of reset period (c) is a higher one of the absolute value |Vthp| of the threshold voltage Vthp of the P-channel transistor and the threshold voltage Vthn of the N-channel transistor. Therefore, the potential of the power supply voltage Vcc at the start of the reset period falls within a range from 0.6 V to 1.0 V.

The end timing of reset period (c) is time at which the potential of the node NA reaches the threshold voltage Vthn of the N-channel transistor. This timing coincides with time at which the power supply voltage Vcc reaches 3*Vthn, and corresponds to a range from 1.8 V to 3.0 V.

Reset period (c) is therefore minimized if reset period (c) starts at time when the power supply voltage Vcc reaches 1.0 V, and is ended at time when the power supply voltage Vcc increases to 1.8 V. Since the power supply voltage Vcc has a potential width of 0.8 V, the circuit can be reliably reset.

According to the first embodiment, a stable ground potential is output from the node NC regardless of the rise rate of the power supply voltage Vcc in reset period (c), as shown in FIG. 7. Even if the power supply voltage Vcc rises moderately, the internal circuit on the output stage can be reliably initialized. After the end of reset period (c), both the P-channel transistors P1 and P2 are turned off to prevent an unnecessary current from flowing between the terminal of the power supply voltage and the ground terminal, resulting in a reduction in power consumption.

Figure 8:
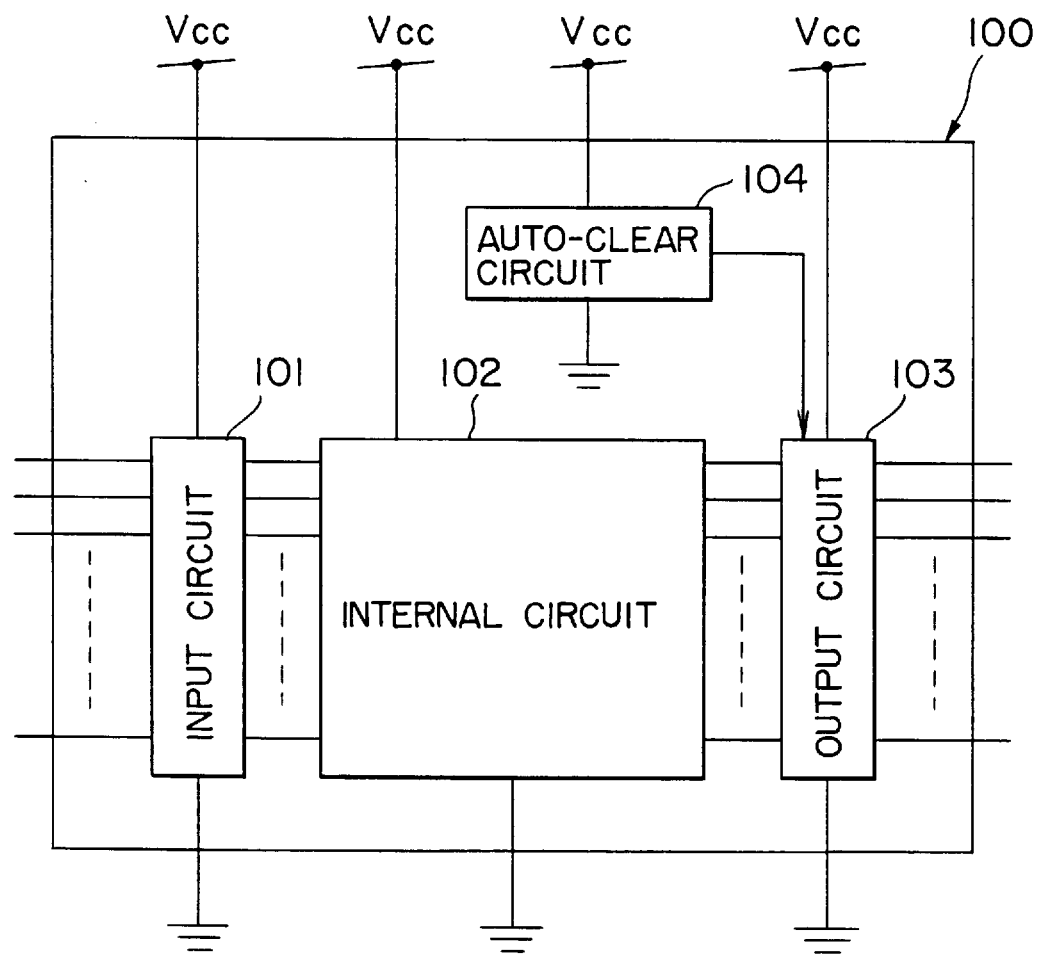
FIG. 8 is a block diagram showing an arrangement in which an auto-clear circuit is incorporated in an integrated circuit according to the first embodiment.

FIG. 8 shows an example of an integrated circuit incorporating the auto-clear circuit according to the first embodiment. An integrated circuit 100 comprises an input circuit 101 including an input buffer for amplifying a signal externally input, and the like, an internal circuit 102 which receives a signal output from the input circuit 101 to perform a process such as a logical operation, an output circuit 103 including an output buffer which receives and amplifies a signal output from the internal circuit 102, and the like, and an auto-clear circuit 104.

The auto-clear circuit 104 has a configuration similar to those in the first embodiment described above. When power is applied, the auto-clear circuit 104 detects a rise in level of the power supply voltage Vcc, generates a reset signal, and outputs this reset signal to the output circuit 103. The output circuit 103 incorporates, e.g., a tri-state buffer. Upon reception of the reset signal, the output circuit 103 supplies a high-impedance output during a predetermined period. With this operation, when power is applied, an external unnecessary signal is not input to the output terminal of the integrated circuit 100, malfunctions are avoided, and the circuit is initialized.

Further, in use of the auto-clear circuit according to the first and second embodiments in the integrated circuit 100, even if the power supply voltage Vcc does not rise steeply, the auto-clear circuit 104 outputs a reset signal to the output circuit 103. Malfunctions are more reliably avoided.

The above-described is merely an example, and does not limit the present invention. For example, the ground potential of the node NC in period (c) is used as a reset signal, but the output potential of the node NB can be used as a reset signal. In the potential division means, instead of using a plurality of resistor elements, a plurality of MOS transistors each having a gate connected to a drain may be serially connected to divide a potential. The latch means inverts an output from the charge/discharge means and outputs the inverted output, but the latch means may output the same potential without performing an inversion process.

What is claimed is:

1. An auto-clear circuit comprising:

switch means connected between a power supply voltage terminal and first and second nodes:

potential division means, connected between the first node and a ground terminal, for outputting a first potential obtained by dividing a potential of the first node:

means for allowing charge/discharge, connected between the second node and a ground terminal, for allowing charge or discharge of the second node by an ON-OFF operation on a basis of the first potential output from said potential division means; and latch means for holding a potential of the second node to output a signal from an output terminal, and supplying the signal to said switch means to control an opening/closing operation, wherein said switch means comprises a first P-channel transistor having two terminals connected between the power supply voltage terminal and the first node and a gate which receives the signal output from said latch means, and a second P-channel transistor having two terminals connected between the power supply voltage terminal and the second node and a gate which receives the signal output from said latch means, said potential division means comprises a plurality of resistors serially connected between the first node and a ground terminal, and outputs the first potential from a connection point between said resistors, said charge/discharge means comprises a first N-channel transistor having two terminals connected between the second node and said ground terminal and a gate which receives the first potential, and said latch means comprises a first inverter having an input side connected to the second node and an output side connected to said output terminal, and a second inverter having an input side connected to said output terminal and an output side connected to the second node.

2. A circuit according to claim 1, wherein said first inverter comprises a third P-channel transistor and a second N-channel transistor each having two terminals serially connected between a power supply voltage terminal and a ground terminal, said third P-channel transistor and said second N-channel transistor having gates commonly connected to the second node, and drains commonly connected to said output terminal, and said second inverter comprises a fourth P-channel transistor and a third N-channel transistor each having two terminals serially connected between said power supply voltage terminal and said ground terminal, said fourth P-channel transistor and said third N-channel transistor having gates commonly connected to said output terminal, and drains commonly connected to the second node, said fourth P-channel transistor having a conductance set larger than that of said third P-channel transistor.

3. An auto-clear circuit comprising:

switch means connected between a power supply voltage terminal and first and second nodes;

potential division means, connected between the first node and a ground terminal, for outputting a first potential obtained by dividing a potential of the first node;

means for allowing charge/discharge, connected between the second node and a ground terminal, for allowing charge or discharge of the second node by an ON-OFF operation on a basis of the first potential output from said potential division means; and latch means for holding a potential of the second node to output a signal from an output terminal, and supplying the signal to said switch means to control an opening/closing operation, wherein said potential division means, while said switch means is closed, receives a potential output from said switch means via the first node and outputs the first potential, said means for allowing charge/discharge, while said switch means is closed, charges the second node until the first potential reaches a first predetermined potential, and discharges the second node when the first potential reaches the first predetermined potential, said latch means latches the potential of the second node when the potential of the second node exceeds a second predetermined potential, and outputs the signal, and said switch means is closed until the signal reaches a third predetermined potential, and is opened when the signal reaches the third predetermined potential, and wherein said switch means comprises a first P-channel transistor having two terminals connected between a power supply voltage terminal and the first node and a gate which receives the signal output from said latch means, and a second P-channel transistor having two terminals connected between a power supply voltage terminal and the second node and a gate which receives the signal output from said latch means, said potential division means comprises a plurality of resistors serially connected between the first node and a ground terminal, and outputs the first potential from a connection point between said resistors, said means for allowing charge/discharge comprises a first N-channel transistor having two terminals connected between the second node and said ground terminal and a gate which receives the first potential, and said latch means comprises a first inverter having an input side connected to the second node and an output side connected to said output terminal, and a second inverter having an input side connected to said output terminal and an output side connected to an input terminal.

4. A circuit according to claim 3, wherein said first inverter comprises a third P-channel transistor and a second N-channel transistor each having two terminals serially connected between a power supply voltage terminal and a ground terminal, said third P-channel transistor and said second N-channel transistor having gates commonly connected to the second node, and drains commonly connected to said output terminal, and said second inverter comprises a fourth P-channel transistor and a third N-channel transistor each having two terminals serially connected between said power supply voltage terminal and said ground terminal, said fourth P-channel transistor and said third N-channel transistor having gates commonly connected to said output terminal, and drains commonly connected to the second node, said fourth P-channel transistor having a conductance set larger than that of said third P-channel transistor.

5. An integrated circuit comprising:

an internal circuit which receives a signal externally input to perform a predetermined process;

an output circuit which receives and amplifies a signal output from said internal circuit to externally output an amplified signal; and an auto-clear circuit which outputs a reset signal after power is applied, said auto-clear circuit having:
  switch means connected between a power supply voltage terminal and first and second nodes,
  potential division means, connected between the first node and a ground terminal, for outputting a first potential obtained by dividing a potential of the first node,
  means for allowing charge/discharge, connected between the second node and a ground terminal, for allowing charge or discharge of the second node by an ON-OFF operation on a basis of the first potential output from said potential division means; and
  latch means for holding a potential of the second node to output a signal from an output terminal, and supplying the signal to said switch means to control an opening/closing operation, said latch means outputting the reset signal, wherein said output circuit receives the reset signal output from said auto-clear circuit and supplies a high-impedance output during a predetermined period, wherein said switch means comprises a first P-channel transistor having two terminals connected between a power supply voltage terminal and the first node and a gate which receives the signal output from said latch means, and a second P-channel transistor having two terminals connected between the power supply voltage terminal and the second node and a gate which receives the signal output from said latch means, said potential division means comprises a plurality of resistors serially connected between the first node and a ground terminal, and outputs the first potential from a connection point between said resistors, said charge/discharge means comprises a first N-channel transistor having two terminals connected between the second node and said ground terminal and a gate which receives the first potential, and said latch means comprises a first inverter having an input side connected to the second node and an output side connected to said output terminal, and a second inverter having an input side connected to said output terminal and an output side connected to the second node.

6. A circuit according to claim 5, wherein said first inverter comprises a third P-channel transistor and a second N-channel transistor each having two terminals serially connected between a power supply voltage terminal and a ground terminal, said third P-channel transistor and said second N-channel transistor having gates commonly connected to the second node, and drains commonly connected to said output terminal, and said second inverter comprises a fourth P-channel transistor and a third N-channel transistor each having two terminals serially connected between said power supply voltage terminal and said ground terminal, said fourth P-channel transistor and said third N-channel transistor having gates commonly connected to said output terminal, and drains commonly connected to the second node, said fourth P-channel transistor having a conductance set larger than that of said third P-channel transistor.

7. An integrated circuit comprising:

an internal circuit which receives a signal externally input to perform a predetermined process;

an output circuit which receives and amplifies a signal output from said internal circuit to externally output an amplified signal; and an auto-clear circuit which outputs a reset signal after power is applied, said auto-clear circuit having
  switch means connected between a power supply voltage terminal and first and second nodes,
  potential division means, connected between the first node and a ground terminal, for outputting a first potential obtained by dividing a potential of the first node.
  means for allowing charge/discharge, connected between the second node and a ground terminal, for allowing charge or discharge of the second node by an ON-OFF operation on a basis of the first potential output from said potential division means, and
  latch means for holding a potential of the second node to output a signal from an output terminal, and supplying the signal to said switch means to control an opening/closing operation, said latch means outputting the reset signal, wherein said output circuit receives the reset signal output from said auto-clear circuit and supplies a high-impedance output during a predetermined period, wherein said potential division means, while said switch means is closed, receives a potential output from said switch means via the first node and outputs the first potential, said means for allowing charge/discharge, while said switch means is closed, charges the second node until the first potential reaches a first predetermined potential, and discharges the second node when the first potential reaches the first predetermined potential, said latch means latches the potential of the second node when the potential of the second node exceeds a second predetermined potential, and outputs the signal, and said switch means is closed until the signal reaches a third predetermined potential, and is opened when the signal reaches the third predetermined potential, wherein said switch means comprises a first P-channel transistor having two terminals connected between a power supply voltage terminal and the first node and a gate which receives the signal output from said latch means, and a second P-channel transistor having two terminals connected between the power supply voltage terminal and the second node and a gate which receives the signal output from said latch means, said potential division means comprises a plurality of resistors serially connected between the first node and a ground terminal, and outputs the first potential from a connection point between said resistors, said means for allowing charge/discharge comprises a first N-channel transistor having two terminals connected between the second node and said ground terminal and a gate which receives the first potential, and said latch means comprises a first inverter having an input side connected to the second node and an output side connected to said output terminal, and a second inverter having an input side connected to said output terminal and an output side connected to the second node.

8. A circuit according to claim 7, wherein said first inverter comprises a third P-channel transistor and a second N-channel transistor each having two terminals serially connected between a power supply voltage terminal and a ground terminal, said third P-channel transistor and said second N-channel transistor having gates commonly connected to the second node, and drains commonly connected to said output terminal, and said second inverter comprises a fourth P-channel transistor and a third N-channel transistor each having two terminals serially connected between said power supply voltage terminal and said ground terminal, said fourth P-channel transistor and said third N-channel transistor having gates commonly connected to said output terminal, and drains commonly connected to the second node, said fourth P-channel transistor having a conductance set larger than that of said third P-channel transistor.

* * * * *